(12) United States Patent
Mauder et al.

(10) Patent No.: US 10,707,865 B2
(45) Date of Patent: *Jul. 7, 2020

(54) SWITCH DEVICE

(71) Applicant: Infineon Technologies Austria AG, Villach (AT)

(72) Inventors: Anton Mauder, Kolbermoor (DE); Martina Seider-Schmidt, Munich (DE); Hans-Joachim Schulze, Taufkirchen (DE); Oliver Hellmund, Neubiberg (DE); Sebastian Schmidt, Munich (DE); Peter Irsigler, Obernberg/Inn (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/180,695

(22) Filed: Nov. 5, 2018

(65) Prior Publication Data

US 2019/0074831 A1 Mar. 7, 2019

Related U.S. Application Data

(63) Continuation of application No. 15/257,729, filed on Sep. 6, 2016, now Pat. No. 10,158,356.

(51) Int. Cl.
*H03K 17/00* (2006.01)
*H03K 17/567* (2006.01)
*H03K 17/082* (2006.01)
*H03K 17/14* (2006.01)
*H03K 17/16* (2006.01)

(52) U.S. Cl.
CPC ....... *H03K 17/567* (2013.01); *H03K 17/0822* (2013.01); *H03K 17/14* (2013.01); *H03K 17/168* (2013.01); *H03K 2217/0063* (2013.01); *H03K 2217/0072* (2013.01)

(58) Field of Classification Search
CPC .. H03K 17/567; H03K 17/0822; H03K 17/14; H03K 17/168; H03K 2217/0063; H03K 2217/0072; H03K 17/04123; H03K 17/063
See application file for complete search history.

(56) References Cited

U.S. PATENT DOCUMENTS

| 5,336,943 | A | 8/1994 | Kelly et al. |
| 5,506,539 | A | 4/1996 | Kelly et al. |
| 7,710,187 | B2 * | 5/2010 | Hiyama ............... H03K 17/168 327/434 |
| 2005/0212588 | A1 * | 9/2005 | Tanizawa ................ G05F 3/205 327/543 |

FOREIGN PATENT DOCUMENTS

EP 2565608 A1 3/2013

OTHER PUBLICATIONS

Hermwille, M., "Application Note AN-7003, Gate Resistor—Principles and Applications," Nov. 12, 2007, pp. 1-10.

* cited by examiner

*Primary Examiner* — Long Nguyen
(74) *Attorney, Agent, or Firm* — Slater Matsil, LLP (57) ABSTRACT

Devices and methods are provided where a control terminal resistance of a transistor device is set depending on operating conditions within a specified range of operating conditions.

16 Claims, 3 Drawing Sheets

SWITCH DEVICE

This application is a continuation of U.S. patent application Ser. No. 15/257,729, filed on Sep. 6, 2016, which application is hereby incorporated herein by reference in its entirety.

TECHNICAL FIELD

The present application relates to switch devices and to corresponding methods.

BACKGROUND

Switch devices are generally used to selectively couple two terminals of the switch device electrically with each other, e.g. to thereby couple for example two parts of an electronic circuit. A particular kind of switch devices are power switch devices, which serve to selectively couple a load to a supply voltage like a positive supply voltage, a negative supply voltage or ground.

In electronic circuits, in many cases transistors are used as switch devices, for example field effect transistors (FETs) like metal oxide semiconductor field effect transistors (MOSFETs), bipolar transistors or insulated gate bipolar transistors (IGBTs). In some applications, such switch devices have to operate over a wide temperature range. For example, IGBT modules in automotive applications like electric vehicles or traction control application have to operate over a wide temperature range, for example from about −55° C. or −40° C. up to 125° C. or even 175° C.

Bipolar semiconductor devices like IGBTs, bipolar transistors or diodes change their switching behavior with temperature. In particular, a carrier lifetime in such devices has a positive temperature coefficient. This e.g. causes a switch-off speed dI/dt (derivative of current I with respect to time t) to become faster (i.e. greater absolute value of dI/dt) with lower temperatures. A fast switching in turn may cause voltage peaks when switching the switch device.

Furthermore, a blocking behavior of the semiconductor devices decreases with decreasing temperature, i.e. breakthrough or other events which cause switch device to conduct current may occur at lower voltages for lower temperatures than for higher temperatures.

In conventional solutions, to avoid or mitigate voltage peaks, switching on and off the switch device is performed slowly enough to keep such voltage peaks within a tolerable range. To achieve this resistors have been coupled to control terminals (for example gate terminals) of switch devices. However, these resistors were designed for a worst case, for example lowest temperature of a specified operating range, which led to comparatively high resistors associated with corresponding high power dissipation of the switch device in particular at higher operating temperatures.

SUMMARY

According to an embodiment, a device has a transistor device that includes a control terminal, a first load terminal and a second load terminal; a circuit configured to provide a switch control signal at an output of the circuit; and a control terminal resistor arrangement coupled between the output of the circuit and the control terminal of the transistor device. The circuit is configured to control the control terminal resistor arrangement to set a resistance value of the control terminal resistor arrangement depending on operating conditions of the transistor device, where the operating conditions are within a specified range of operating conditions for the transistor device.

According to another embodiment, a device includes switch transistor, where the switch transistor comprises a first load terminal, a second load terminal and a control terminal; a first resistor, where a first terminal of the first resistor is coupled to the control terminal and a second terminal of the first resistor is coupled to a first voltage via a first switch, and the first voltage is associated with a first switching state of the switching device; a second resistor, where a first terminal of the second resistor is coupled to the control terminal and the second terminal of the resistor is coupled to the first voltage via a second switch; and a circuit to control the first and second switches depending on a switching state to which the transistor device is to be set and depending on an operating condition associated with temperature.

According to a further embodiment, a method includes providing a first control terminal resistance for a transistor switch having a control terminal and first and second load terminals at first operating conditions; and providing a second control terminal resistance at second operating conditions different from the first operating conditions, the first and second operating conditions being within a specified range of operating conditions.

The above summary is merely intended to give a brief overview over some features of some embodiments and is not to be construed as limiting. In particular, other embodiments may have other features or components than the ones explained above.

DETAILED DESCRIPTION OF ILLUSTRATIVE EMBODIMENTS

Various embodiments will now be described in detail referring to the attached drawings. These embodiments are given by way of example only and are not to be construed as limiting. For example, while embodiments may be described comprising a plurality of details or elements, in other embodiments some of these details or elements may be omitted, and/or may be replaced by alternative features or elements. Features or elements from various embodiments may be combined to form further embodiments unless noted otherwise. Variations and modifications described with respect to one of the embodiments may also be applied to other embodiments.

In the embodiments shown and described, any direct connection or coupling between components, i.e. connection or coupling without intervening elements, may also be replaced by an indirect connection or coupling, i.e. a connection or coupling with one or more additional intervening elements, as long as the general purpose of the connection or coupling, for example to transmit a certain kind of information, to transmit a certain kind of signal or to provide a certain kind of control, is essentially maintained.

Embodiments relate to switch devices comprising transistor switches. Switch devices and transistors are generally described as having a control terminal and at least two load terminals. By applying an appropriate signal to the control terminal, an electrical low-ohmic connection between the load terminals may be selectively established. For example, in some applications as power switches one load terminal may be coupled to a supply voltage, and another load terminal may be coupled to a load, and by applying appropriate signals to the control terminal the load may selectively be coupled to the supply voltage.

In case of a field effect transistor like a MOSFET, the control terminal corresponds to the gate terminal, and the load terminals correspond to source and drain terminal. In case of a bipolar transistor, the control terminal corresponds to the base terminal, and the load terminals correspond to emitter and collector terminals. In case of an insulated gate bipolar transistor (IGBT), the control terminal corresponds to the gate terminal, and the load terminal corresponds to collector and emitter terminals.

A transistor or switch device is referred to as being closed or on when it is conducting between its load terminals. It is referred to as open or off if it is essentially (i.e. apart from some undesired leakage currents) non-conducting between its load terminals.

A specified range of operating conditions, as used herein, refers to operating conditions under which a device is intended to be used, in contrast to operating conditions outside the specified range like overcurrent or overtemperature, which may, for example, lead to damage of a device.

In some embodiments, a resistance associated with the control terminal is set depending on operating conditions. The operating conditions may be associated with temperature or may correspond to temperature. In particular, the resistance may be increased for operating conditions associated with lower temperatures. This, in some embodiments, may decrease voltage peaks for lower temperatures, whereas for operating conditions associated with higher temperatures a lower resistance may be used, which may reduce power loss in some embodiments.

Figure 1:
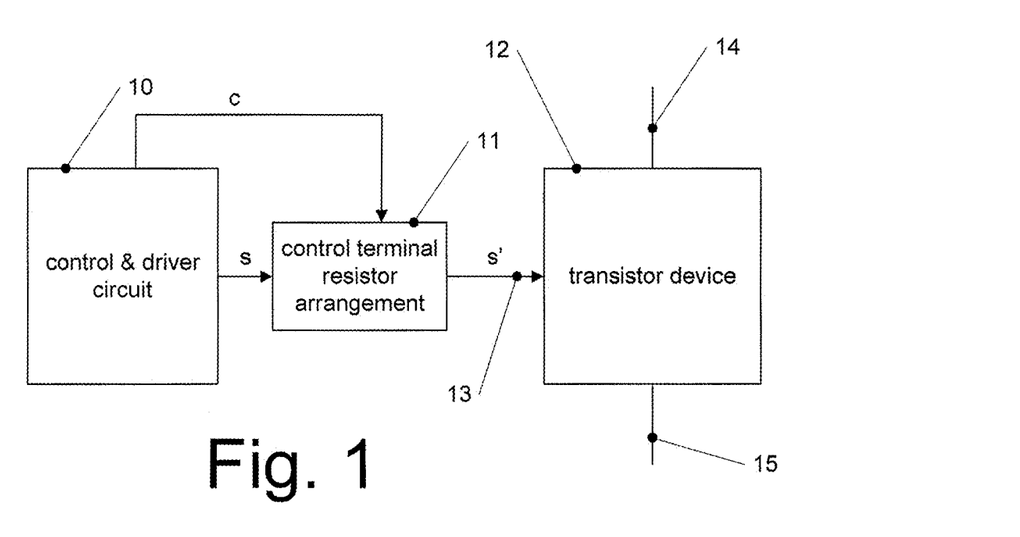
FIG. 1 is a block diagram of a switch device according to an embodiment.

Turning now to the Figures, FIG. 1 illustrates a block diagram of a switch device according to an embodiment. The switch device of FIG. 1 includes a transistor device 12 having a control terminal 13 and first and second load terminals 14, 15. Depending on a signal s' applied to control terminal 13, an electrical connection between load terminals 14, 15 is closed or open.

Transistor device 12 is controlled by a control and driver circuit 10. As used herein, a control circuit or controller may relate to a circuit which controls a switching (opening and closing) of transistor device 12 by generating corresponding signal pulses. A driver circuit refers to circuit parts which then output the control signal with appropriate voltage levels for opening and closing transistor device 12.

In the embodiment of FIG. 1, furthermore a control terminal resistor arrangement 11 is coupled between control and driver circuit 10 and transistor device 12. Control and driver circuit 10 outputs a signal s for controlling switching of transistor device 12, which is provided to control terminal 13 via resistor arrangement 11 as the aforementioned signal s'. A resistance value of control terminal resistor arrangement 11 influences a switching speed or a transient between the closed state and the open state and vice versa of transistor device 12. Resistor arrangement 11 in the embodiment of FIG. 1 has a variable resistance value controlled by a control signal c from control and driver circuit 10. Signal c may be generated in a control circuit part or a driver circuit part of circuit 10. It should be noted that resistor arrangement 11 may comprise separate resistors for switching on and switching off transistor device 12. In this case, varying the resistance by signal c may be performed for switching on, for switching off or both switching on or switching off transistor device 12.

In particular, via control signal c a resistance value of resistor arrangement 11 for switching on transistor device 12, switching off transistor device 12 or both may be set to higher resistance value for operating conditions associated with lower temperatures and to lower resistance values for operating conditions associated with higher temperatures.

In some embodiments, the temperature may be directly measured, and control signal c may be determined based on temperature. In other embodiments, an operating condition associated with lower temperature may be startup of a device of FIG. 1, and an operating condition associated with higher temperature may be a phase after startup, for example after a certain time or after a certain number of switching events like switching pulses determined by signal s. In the latter case, is assumed that the device of FIG. 1 heats up in operation, and may be cold at startup. For example, in automotive environments, in winter all devices within an automobile may be cold at startup, but may warm up after some driving.

In some embodiments, for choosing the resistance of resistor arrangement 11, a plurality of switchable resistors which are selectively activated may be provided. It should be noted that while in some embodiments two different resistance values for switching on and/or for switching off may be used, in other embodiments more than two different values, associated with more than two different operating conditions, may be used. Therefore, a description of an embodiment using two different operating conditions is not to be construed as excluding the possibility of further operating conditions with corresponding associated resistance values.

Figure 2:
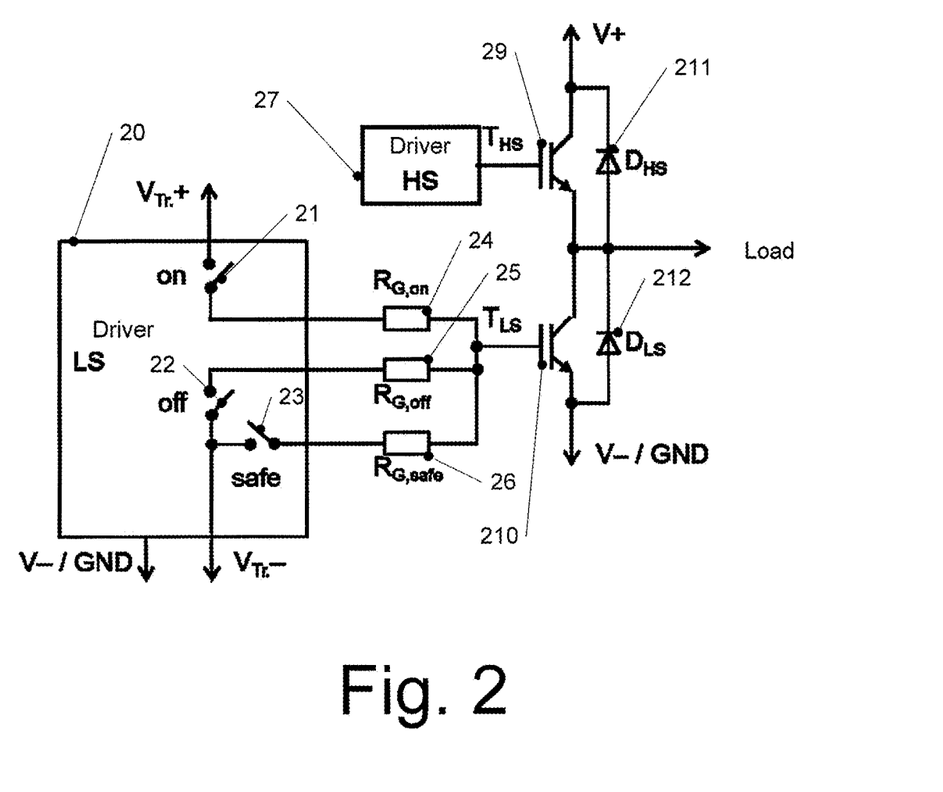
FIG. 2 is a circuit diagram illustrating a switch device according to an embodiment.

FIG. 2 illustrates a circuit diagram of a device according to an embodiment. The device of FIG. 2 comprises a first switch transistor 29 and a second switch transistor 210 arranged in a half bridge configuration to supply a load. First switch transistor 29 and second switch transistor 210 in the embodiment of FIG. 2 are implemented as insulated gate bipolar transistors (IGBTs). First switch transistor 29 is coupled between a positive supply voltage V+ and a load with its load terminals, and second switch transistor 210 is coupled between the load and a negative supply voltage V− or ground with its load terminal.

A diode 211 is coupled in parallel to the load terminals of first switch transistor 29, and a diode 212 is coupled in parallel to the load terminals of switch transistor 210. These diodes enable a reverse current flow in case of inductive loads, as conventionally known in the art.

First switch transistor 29 is also referred to as a high side switch (selectively coupling the load to a positive supply voltage), and second switch transistor 210 is also referred to as a low side switch (coupling the load to a negative supply voltage or ground).

First switch transistor 29 is driven by a high side driver 27 via associated gate resistances (not shown in FIG. 2), and second switch transistor 210 is driven by a low side driver 20 via associated gate resistances 24, 25, 26. As the configuration of high side driver 27 may correspond to the configuration of low side driver 20, only low side driver 20 and the associated gate resistances 24 to 26 are shown in detail in FIG. 2 and will be explained below. The configuration of high side driver 27 in some embodiments may correspond to this configuration of low side driver 20.

Low side driver 20 comprises switches 21, 22 and 23. Switches 21, 22 and 23 may be implemented as transistor switches. Switch 21 may be closed to couple a gate terminal of second switch transistor 210 with a positive driver voltage $V_{tr,+}$. $V_{tr,+}$ may be lower than V+ in particular in high voltage application where V+ is a comparative high voltage, for example several tens or several hundreds of Volts. In particular, when switch 21 is closed, the gate terminal of second switch transistor 210 is coupled to $V_{tr,+}$ via a resistor 24 having a resistance value $R_{G,on}$, which provides a gate resistance, for switching on second switch transistor 210.

Furthermore, for switching second switch transistor 210 off, a switch 22 is closed, to couple the gate terminal of second switch transistor 210 with a negative driver voltage $V_{tr,-}$ via a resistor 25. Resistor 25 provides a gate resistance $R_{G,off}$.

In the embodiment of FIG. 2, the gate terminal of second switch transistor 210 may also be coupled to $V_{tr,-}$ by closing a switch 23 via a resistor 26 providing a gate resistance $R_{G,safe}$. In embodiments, $R_{G,safe}$ is larger than $R_{g,off}$ for example at least two times greater, or at least five times greater, although other relationships may also apply.

In conventional solutions, switch 23 is closed at certain fault conditions like overcurrent or short circuit conditions, e.g., in operation conditions outside a range for which second switch transistor 210 is specified. This prevents a switching overvoltage when switching off switch transistor 210 in such fault conditions. In such conventional approaches, a corresponding fault signal is then provided to a controller, which may take further measures, for example bring the device to a safe state.

In embodiments, in addition or alternative to this conventional approach, switch 23 is also used within a specified operating range of switch transistor 210 for certain operating conditions, in particular operating conditions associated with temperature. For example, for lower temperatures (for example temperatures below a threshold value), switch 23 is used for switching switch transistor 210 off whereas for other operating conditions, for example temperatures above the threshold, switch 22 is used. In other words, this approach for lower temperatures resistor 26 acts as a gate resistance, i.e. and for higher temperatures, resistor 25 acts as a gate resistance, such that for lower temperatures a higher gate resistance is used.

In other embodiments, the operating conditions may not be temperature directly, but only indirectly associated with temperature. For example during a startup switch of the device of FIG. 2 switch 23 may be used, and after a startup phase switch 22 may be used for switching switch transistor 210 off. Also in this case, the operating conditions are associated with temperature, as at startup devices often have a lower temperature, then heating up during some operation time. For example, such startup phase may be determined as a number of switching pulses (i.e. a number of times switch transistor 210 is switched on and off), or may be defined by a threshold time.

By using a higher gate resistance when switching off in operation conditions associated with lower temperatures voltage peaks caused by switching may be avoided in some embodiments. When switching off with a higher gate resistance the switching transient is slowed down leading to relatively higher switching losses. Moreover, by using a lower gate resistance in operating conditions associated with higher temperatures power dissipation may be reduced in some embodiments.

The temperature may be measured by a conventional temperature sensor, as provided in many IGBT modules for example for determining an overtemperature. This temperature sensor may for example measure a temperature of a heat sink or of a module plate. In other embodiments, dedicated temperature sensors may be provided. In some embodiments, even when the operating conditions comprise a startup phase based on a time threshold or a number of switching, using different operating conditions may only be activated if the temperature at the beginning of startup is below a threshold value. For example, in automotive applications, in summer the temperature may be high enough already at startup to only use resistor 25 and switch 22, while in winter where the temperatures are colder in embodiments switch 24 and resistor 26 may be used.

Other conventional temperature sensing approaches for semiconductor devices may also be used.

In the embodiment of FIG. 2, the gate resistance for switching off second switch transistor 210 depends on the operating conditions, while the gate resistance for switching on is always the same (determined by resistor 24). This is sufficient in many applications where switching off the transistor may be more critical than switching on with respect to voltage spikes. For example, in implementations where diodes 211, 212 are implemented as unipolar diodes as e.g. silicon carbide (SiC) Schottky diodes, their function is largely independent from temperature, which prevents or mitigates voltage spikes when switching on. In other embodiments, diodes 211, 212 may be silicon-based pn-, pn⁻n- or pin-diodes, which also have a significant temperature dependence in their dynamic electrical characteristic. In such cases, a varying gate resistance may also be provided for switching on second switch transistor 210. An example for such an implementation will now be described referring to FIG. 3.

Figure 3:
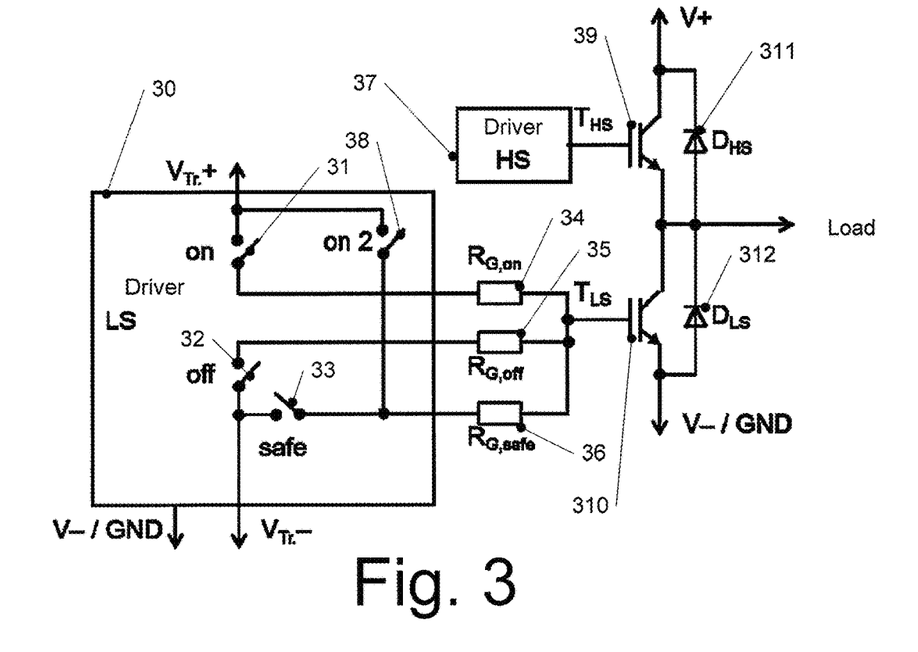
FIG. 3 is a circuit diagram illustrating a switch device according to an embodiment.

FIG. 3 illustrates a circuit diagram of a device according to an embodiment. The device of FIG. 3 comprises a first switch transistor 39 and a second switch transistor 310 arranged in a half bridge configuration to supply a load. First switch transistor 39 and second switch transistor 310 in the embodiment of FIG. 3 are implemented as insulated gate bipolar transistors (IGBTs). First switch transistor 39 is coupled between a positive supply voltage V+ and a load with its load terminals, and second switch transistor 310 is coupled between the load and a negative supply voltage V− or ground with its load terminal.

A diode 311 is coupled in parallel to the load terminals of first switch transistor 39, and a diode 312 is coupled in parallel to the load terminals of switch transistor 310. These diodes enable a reverse current flow in case of inductive loads, as conventionally known in the art.

First switch transistor 39 is also referred to as a high side switch (selectively coupling the load to a positive supply voltage), and second switch transistor 310 is also referred to as a low side switch (coupling the load to a negative supply voltage or ground).

First switch transistor 39 is driven by a high side driver 37 via associated gate resistances (not shown in FIG. 3), and second switch transistor 310 is driven by a low side driver 30 via associated gate resistances 34, 35, 36. As the configuration of high side driver 37 may correspond to the configuration of low side driver 30, only low side driver 30 and the associated gate resistances 34 to 36 are shown in detail in FIG. 3 and will be explained below. The configuration of high side driver 37 in some embodiments may correspond to this configuration of low side driver 30.

Low side driver 30 includes switches 31, 32 and 33. Switches 31, 32 and 33 may be implemented as transistor switches. Switch 31 may be closed to couple a gate terminal of second switch transistor 310 with a positive driver voltage $V_{tr,+}$. $V_{tr,+}$ may be lower than V+ in particular in high voltage application where V+ is a comparative high voltage, for example several tens or several hundreds of Volts. In particular, when switch 31 is closed, the gate terminal of second switch transistor 310 is coupled to $V_{tr,+}$ via a resistor 34 having a resistance value $R_{G,on}$, which provides a gate resistance, for switching on second switch transistor 310.

Furthermore, for switching second switch transistor 310 off, a switch 32 is closed, to couple the gate terminal of second switch transistor 310 with a negative driver voltage $V_{tr,-}$ via a resistor 35. Resistor 35 provides a gate resistance $R_{G,off}$.

In the embodiment of FIG. 3, the gate terminal of second switch transistor 310 may also be coupled to $V_{tr,-}$ by closing a switch 33 via a resistor 36 providing a gate resistance $R_{G,safe}$. In embodiments, $R_{G,safe}$ is larger than $R_{g,off}$ for example at least two times greater, or at least five times greater, although other relationships may also apply.

In conventional solutions, switch 33 is closed at certain fault conditions like overcurrent or short circuit conditions, i.e. in operation conditions outside a range for which second switch transistor 310 is specified. This prevents a switching overvoltage when switching off switch transistor 310 in such fault conditions. In such conventional approaches, a corresponding fault signal is then provided to a controller, which may take further measures, for example bring the device to a safe state.

In embodiments, in addition or alternative to this conventional approach, switch 33 is also used within a specified operating range of switch transistor 310 for certain operating conditions, in particular operating conditions associated with temperature. For example, for lower temperatures (for example temperatures below a threshold value), switch 33 is used for switching switch transistor 310 off whereas for other operating conditions, for example temperatures above the threshold, switch 32 is used. In other words, this approach for lower temperatures resistor 36 acts as a gate resistance, i.e. and for higher temperatures, resistor 35 acts as a gate resistance, such that for lower temperatures a higher gate resistance is used.

In other embodiments, the operating conditions may not be temperature directly, but only indirectly associated with temperature. For example during a startup switch of the device of FIG. 3 switch 33 may be used, and after a startup phase switch 32 may be used for switching switch transistor 310 off. Also in this case, the operating conditions are associated with temperature, as at startup devices often have a lower temperature, then heating up after some operation time. For example, such startup phase may be determined as a number of switching pulses (i.e. a number of times switch transistor 310 is switched on and off), or may be defined by a threshold time.

By using a higher gate resistance when switching off in operation conditions associated with lower temperatures voltage peaks caused by switching may be avoided in some embodiments. Moreover, by using a lower gate resistance in operating conditions associated with higher temperatures power dissipation may be reduced in some embodiments.

The temperature may be measured by a conventional temperature sensor, as provided in many IGBT modules for example for determining an overtemperature. This temperature sensor may for example measure a temperature of a heat sink or of a module plate. In other embodiments, dedicated temperature sensors may be provided. In some embodiments, even when the operating conditions comprise a startup phase based on a time threshold or a number of switching, using different operating conditions may only be activated if the temperature at the beginning of startup is below a threshold value. For example, in automotive applications, in summer the temperature may be high enough already at startup to only use resistor 35 and switch 32, while in winter where the temperatures are colder in embodiments switch 33 and resistor 36 may be used.

Other conventional temperature sensing approaches for semiconductor devices may also be used.

In the embodiment of FIG. 3, the gate resistance for switching off second switch transistor 310 depends on the operating conditions, while the gate resistance for switching on is always the same (determined by resistor 34). This is sufficient in many applications where switching off the transistor may be more critical than switching on with respect to voltage spikes. For example, in implementations where diodes 311, 312 are implemented as unipolar diodes as e.g., silicon carbide (SiC) Schottky diodes, their function is largely independent from temperature, which prevents or mitigates voltage spikes when switching on. In other embodiments, diodes 311, 312 may be silicon-based pn-, pn⁻n- or pin-diodes, which also have a significant temperature dependence in their dynamic electrical characteristic. In such cases, a varying gate resistance may also be provided for switching on second switch transistor 310. An example for such an implementation will now be described referring to FIG. 3.

The above-described operation of the embodiment of FIG. 3 essentially corresponds to the operation of the embodiment of FIG. 2. In addition, the embodiment of FIG. 3 includes a switch 38 for selectively coupling the gate terminal of second switch transistor 310 to the positive driver voltage $V_{tr,+}$ resistor 36. Similar to the case explained above for switching off second switch transistor 310, by closing switch 38 second switch transistor 310 may be switched on using the higher gate resistor 36 (compared to resistor 34) in operating conditions associated with low temperatures, for example at startup. In this case, also for switching on a higher gate resistance may be provided in certain operating phases, and by (re)using resistor 36 no additional resistor has to be provided. In other embodiments, a further resistor may be provided having a higher resistance than resistor 34 for switching on second switch transistor 310.

The operating conditions depending on which switch 38 or switch 31 is used for switching second switch transistor 310 off may be the same as used for switching off (using switch 32 or 33), but may also be different, for example use different temperature or time thresholds.

In the embodiments of FIGS. 2 and 3, different gate resistors are used for controlling second switch transistor 210 or 310 at least in some operating conditions, for example at higher temperatures. In other embodiments, at least in part the same resistors may be used. A corresponding embodiment will now be described referring to FIG. 4.

Figure 4:
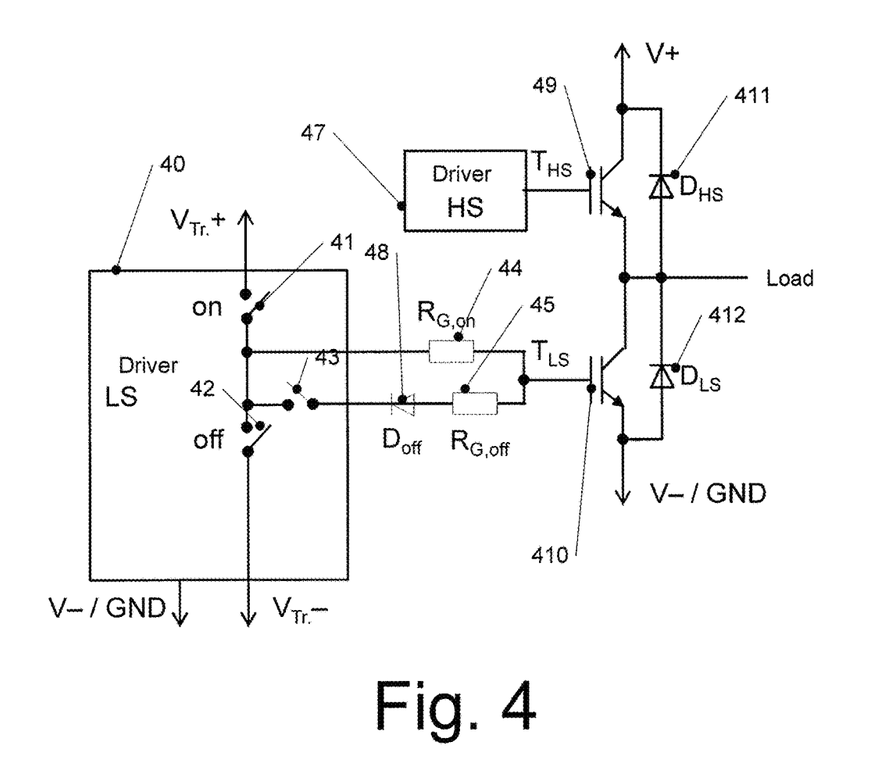
FIG. 4 is a circuit diagram illustrating a switch device according to an embodiment.

The device of FIG. 4 comprises a first switch transistor 49 and a second switch transistor 410 arranged in a half bridge configuration to supply a load. First switch transistor 49 and second switch transistor 410 in the embodiment of FIG. 4 are implemented as insulated gate bipolar transistors (IGBTs). First switch transistor 49 is coupled between a positive supply voltage V+ and a load with its load terminals, and second switch transistor 410 is coupled between the load and a negative supply voltage V− or ground with its load terminal.

A diode 411 is coupled in parallel to the load terminals of first switch transistor 49, and a diode 412 is coupled in parallel to the load terminals of switch transistor 410. These diodes enable a reverse current flow in case of inductive loads, as conventionally known in the art.

First switch transistor 49 is also referred to as a high side switch (selectively coupling the load to a positive supply voltage), and second switch transistor 410 is also referred to as a low side switch (coupling the load to a negative supply voltage or ground).

First switch transistor 49 is driven by a high side driver 47 via associated gate resistances (not shown in FIG. 2), and second switch transistor 410 is driven by a low side driver 40 via associated gate resistances 44, 45. As the configuration of high side driver 47 may correspond to the configuration of low side driver 40, only low side driver 40 and the associated gate resistances 44, 45 are shown in detail in FIG. 4 and will be explained below. The configuration of high side driver 47 in some embodiments may correspond to this configuration of low side driver 40. It should be noted that configurations from different embodiments may be "mixed", e.g. a high side driver may be implemented as discussed with respect to FIG. 2, and a low side driver may be implemented as discussed with respect to FIG. 4 etc.

Driver 40 comprises a switch 41 to switch transistor 410 on by coupling a gate terminal of second switch transistor 410 to $V_{tr,+}$ via resistor 44 having a resistance $R_{G,on}$.

Furthermore, through second switch transistor 410, the gate terminal of second switch transistor 410 is selectively coupled to $V_{tr,-}$ by closing switch 42. The gate terminal of transistor 410 is then coupled to $V_{tr}$ also via resistor 44.

Additionally, switch 43 may be closed, additionally coupling the gate of transistor 410 to $V_{tr,-}$ via diode 48 and a resistor 45 having a resistance value $R_{G,off}$. When switch 43 is closed, the effective gate resistance for opening second switch transistor 410 essentially corresponds to a parallel connection of resistors 44, 45 with an effective resistance $R=R_{G,on} \times R_{G,off}(R_{G,on}+R_{G,off})$, thus leading to a lower resistance than the resistance of $R_{G,on}$. Please note that even when switch 43 is closed, diode 48 prevents the path via diode 48 and resistor 45 from being effective for switching second switch transistor 410 on.

Therefore, in embodiments, for operating conditions associated with lower temperatures, switch 43 may be opened effectively increasing the gate resistance for switching off second switch transistor 410, and for operating conditions associated with higher temperatures, switch 43 may be closed, effectively lowering the gate resistance. The operating conditions as explained with respect to FIGS. 1 and 2 may be determined based on a temperature measurement or also based on a time from startup, for example by using a time threshold or by counting a number of switching pulses.

It should also be noted that in other embodiments diode 48 may be omitted, such that both for switching on and switching off second switch transistor 410 the effective gate resistance may be varied.

As can be seen from the embodiments of FIGS. 2 to 4, various configurations of switches in a driver and gate resistors may be used to provide a variable gate resistance depending on operating conditions, in particular operating conditions associated with temperature.

Figure 5:
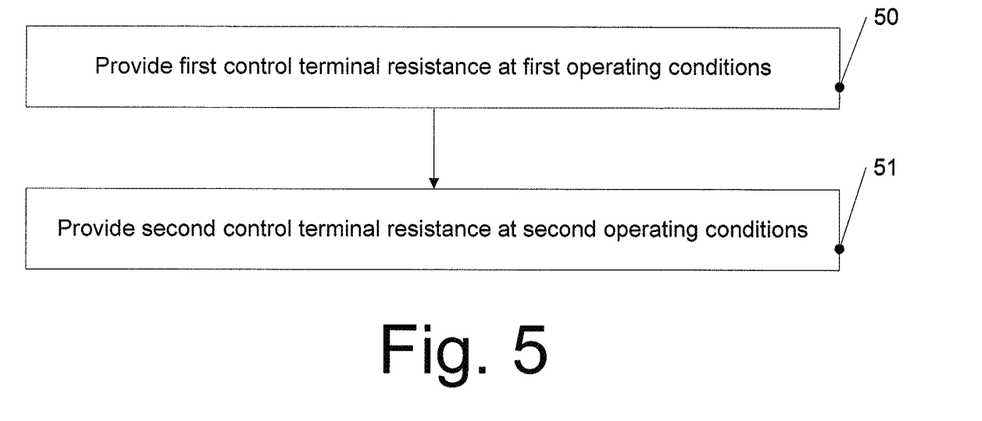
FIG. 5 is a flow chart illustrating a method according to an embodiment.

FIG. 5 is a flow chart illustrating a method according to an embodiment. The method of FIG. 5 may be implemented using any of the devices discussed with reference to FIGS. 1 to 4, but may also be implemented independently therefrom. Nevertheless, for ease of reference and to provide a better understanding, the method of FIG. 5 will be explained referring to FIGS. 1 to 4. However, this is not to be construed as limiting.

Furthermore, while the method of FIG. 5 is presented as a series of acts or events, in the order in which these acts or events are described and shown in FIG. 5 is not to be construed as limiting.

At 50, the method of FIG. 5 comprises providing a first control terminal resistance at first operating conditions. The first control terminal resistance may be provided for example by closing appropriate switches in drivers like drivers 20, 30 and 40 of FIGS. 2 to 4 or by providing control signal c of FIG. 1 accordingly.

The control terminal resistance is a resistance via which control signals are provided to a control terminal of a switch device, in particular a transistor.

At 51, the method comprises providing a second control terminal resistance at second operating conditions different from the first operating conditions. Providing the second control terminal resistance may comprise closing switches and drivers 20, 30 or 40 of FIGS. 2 to 4 or setting a control signal c in FIG. 1 accordingly.

The first and second operating conditions may be associated with temperature, for example with certain temperature ranges. For example, the first operating conditions may be associated with lower temperatures than the second operating conditions. In this case, the first control terminal resistance may have a higher resistance value than the second control terminal resistance. The first operating conditions may for example be associated with a startup phase, while the second operating conditions may be associated with a phase after startup.

The first and second control terminal resistance may be provided for switching on a switch device having the control terminal, switching off a switch device having the control terminal or both. Different resistances may be provided for switching on and switching off.

According to some embodiments, the following examples are provided:

Example 1

A device, comprising:
a transistor device comprising a control terminal, a first load terminal and a second load terminal,
a circuit configured to provide a switch control signal at an output of the circuit,
a control terminal resistor arrangement coupled between the output of the circuit and the control terminal of the transistor device,
wherein the circuit is configured to control the control terminal resistor arrangement to set a resistance value of the control terminal resistor arrangement depending on operating conditions of the transistor device, the operating conditions being within a specified range of operating conditions for the transistor device.

Example 2

The device of example 1, wherein the transistor device comprises an insulated gate bipolar transistor.

Example 3

The device of example 1 or 2, wherein the circuit is configured to control the control resistor arrangement to set the resistance for one or both of a switching on of the transistor device or a switching off of the transistor device.

Example 4

The device of any one of examples 1-3, wherein the operating conditions are associated with a temperature of the transistor device.

Example 5

The device of example 4, wherein setting the resistance comprises setting the resistance to a higher resistance value at lower temperatures and to a lower resistance value at higher temperatures.

Example 6

The device of example 4 or 5, wherein operating conditions associated with a lower temperature comprise a startup phase of the device, and operating conditions associated with higher temperatures comprise an operation after the startup phase.

Example 7

The device of example 6, wherein the circuit is configured to set the resistance based on one of a time after a start of the device or a number of switching pulses after the start.

Example 8

The device of any one of examples 1-7, wherein the circuit comprises a driver, the driver comprising a plurality of switches to selectively couple the control terminal to a first voltage for closing the switch transistor or a second voltage for opening the switch transistor, and at least one switch for setting the resistance value.

Example 9

The device of any one of examples 1-8, wherein the control terminal resistor arrangement comprises a plurality of resistors.

Example 10

A device, comprising:
a switch transistor, wherein the switch transistor comprises a first load terminal, a second load terminal and a control terminal,
a first resistor, wherein a first terminal of the first resistor is coupled to the control terminal and a second terminal of the first resistor is coupled to a first voltage via a first switch, wherein the first voltage is associated with a first switching state of the switching device,
a second resistor, wherein a first terminal of the second resistor is coupled to the control terminal and the second terminal of the resistor is coupled to the first voltage via a second switch, and
a circuit to control the first and second switches depending on a switching state to which the transistor device is to be set and depending on an operating condition associated with temperature.

Example 11

The device of example 10, wherein the first resistor has a lower resistance value than the second resistor, and wherein the circuit is configured to operate the first switch in operating conditions associated with higher temperatures and the second switch in operating conditions associated with lower temperatures.

Example 12

The device of example 10 or 11, wherein the second terminal of the first transistor is coupled to a first terminal of the first switch, a second terminal of the first switch being coupled to the first voltage, and wherein the second terminal of the second resistor is coupled to a first terminal of the second switch, wherein a second terminal of the second switch is coupled to the first terminal of the first switch.

Example 13

The device of example 12, further comprising a diode coupled between the second resistor and the second switch.

Example 14

The device of claim 13, further comprising a third switch coupled between the first resistor and a second voltage different from the first voltage, the second voltage being associated with a second switching state of the transistor device.

Example 15

The device of any one of examples 10-14, further comprising a third resistor, wherein a first terminal of the third resistor is coupled with a control terminal of the transistor device and a second terminal of the third resistor is coupled to a second voltage via a third switch, wherein the second voltage is associated with a second switching state of the switch device.

Example 16

The device of example 15, further comprising a fourth switch coupled between the second voltage and the second resistor, wherein the circuit is configured to control the third switch and the fourth switch depending on the switching state the transistor is to be set to and on the operating conditions associated with temperature.

Example 17

A method, comprising:
providing a first control terminal resistance for a transistor switch having a control terminal and first and second load terminals at first operating conditions, and
providing a second control terminal resistance at second operating conditions different from the first operating conditions, the first and second operating conditions being within a specified range of operating conditions of the transistor switch.

Example 18

The method of example 17, wherein the first and second operating conditions are associated with different temperature ranges.

Example 19

The method of example 18, wherein the first operating conditions are associated with lower temperatures than the first operating conditions, and wherein the first control terminal resistance is higher than the second control terminal resistance.

Example 20

The method of example 18 or 19, wherein the first operating conditions are associated with a startup phase, and the second operating conditions are associated with a phase after startup.

The above embodiments serve as examples only and are not be construed as limiting.

What is claimed is:

1. A circuit comprising:
   a first circuit path coupled between a first reference voltage node and a plurality of first drive terminals configured to be coupled to a control node of a transistor device via a first resistor network, wherein the first circuit path is configured to connect the first reference voltage node to at least one first drive terminal of the plurality of first drive terminals when a switch control signal is in a first state, the first circuit path is configured to disconnect the first reference voltage node from the at least one first drive terminal when the switch control signal is in a second state different from the first state, and the first reference voltage node is configured to provide a voltage that sets the transistor device in a first switching state, wherein the first switching state of the transistor device is an off-state;
   a second circuit path coupled between a second reference voltage node and a second drive terminal configured to be coupled to the control node of the transistor device via a second resistor network, wherein the second circuit path is configured to connect the second reference voltage node to the second drive terminal when the switch control signal is in the second state, the second circuit path is configured to disconnect the second reference voltage node from the second drive terminal when the switch control signal is in the first state, and the second reference voltage node is configured to provide a voltage that sets the transistor device in a second switching state different from the first switching state, the second reference voltage node is different from the first reference voltage node, and the first circuit path is different from the second circuit path, and the second switching state of the transistor device is an on-state; and
   a controller coupled to the first circuit path and to the second circuit path, wherein the controller is configured to select the at least one first drive terminal of the plurality of first drive terminals to which the first circuit path connects the first reference voltage node depending on operating conditions of the transistor device, the operating conditions are within a specified range of operating conditions for the transistor device, the operating conditions are associated with a temperature of the transistor device, the controller is configured to select which of the least one first drive terminal of the plurality of first drive terminals are connected to the first reference voltage node to set a higher resistance value at lower temperatures and to set a lower resistance value at higher temperatures, the controller is configured to select the at least one first drive terminal to set a resistance value between the control node of the transistor device and the first reference voltage node when the switch control signal is in the first state, and the circuit is configured to apply a same voltage to the selected at least one first drive terminal of the plurality of first drive terminals regardless of the set resistance value.

2. The circuit of claim 1, further comprising the transistor device, wherein the transistor device comprises an insulated gate bipolar transistor.

3. The circuit of claim 1, wherein operating conditions associated with a lower temperature comprise a startup phase of the circuit, and operating conditions associated with higher temperatures comprise an operation after the startup phase.

4. The circuit of claim 3, wherein the controller is configured to select which of the at least one first drive terminal of the plurality of first drive terminals are connected to the first reference voltage node to set the resistance value based on one of a time after a start of the circuit or a number of switching pulses after the start.

5. The circuit of claim 1, wherein:
   the first circuit path comprises a plurality of first switches coupled between the first reference voltage node and corresponding first drive terminals of the plurality of first drive terminals; and
   the second circuit path comprises a second switch coupled between the second reference voltage node and the second drive terminal.

6. The circuit of claim 1, wherein:
   the first reference voltage node is a ground node; and
   the second reference voltage node is a power supply node.

7. The circuit of claim 1, further comprising the first resistor network and the second resistor network, wherein
   the first resistor network comprises a plurality of first resistors having first terminals coupled to corresponding first drive terminals of the plurality of first drive terminals, and second terminals configured to be coupled to the control node of the transistor device; and
   the second resistor network comprises a second resistor having a first end coupled to the second drive terminal and a second end configured to be coupled to the control node of the transistor device.

8. The circuit of claim 1, wherein the specified range of operating conditions is a safe operating range that does not damage the transistor device.

9. A device, comprising:
   a first switch coupled between a first voltage terminal and a first drive terminal configured to be coupled to a control terminal of a switch transistor via a first resistor, wherein the first voltage terminal is configured to provide a first voltage associated with a first switching state of the switch transistor, and the first switch is configured to provide the first voltage to the first drive terminal;
   a second switch coupled between the first voltage terminal and a second drive terminal configured to be coupled to the control terminal of the switch transistor via a second resistor, wherein the second switch is configured to provide the first voltage to the second drive terminal;
   a third switch coupled between a second voltage terminal and a third drive terminal configured to be coupled to the control terminal of the switch transistor via a third resistor, wherein the second voltage terminal is configured to provide a second voltage associated with a second switching state of the switch transistor different from the first switching state; and
   a circuit to control the first, second and third switches depending on a switching state to which the switch transistor is to be set and depending on an operating condition associated with temperature, wherein the first switching state of the switch transistor is an off-state and the second switching state of the switch transistor is an on-state, wherein the circuit is configured to activate the first switch and not the second switch in operating conditions associated with higher temperatures, and is configured to activate the second switch in operating conditions associated with lower temperatures.

10. The device of claim 9, further comprising the first resistor and the second resistor, wherein the first resistor has a lower resistance value than the second resistor.

11. The device of claim 9, further comprising a fourth switch coupled between the second voltage terminal and the second drive terminal, wherein the circuit is configured to control the third switch and the fourth switch depending on the switching state of the switch transistor and on operating conditions associated with temperature.

12. A method of controlling a switching transistor, the method comprising:
setting the switching transistor to a first switching state under a first operating condition by activating a first switch coupled between a first voltage terminal and a control node of the switching transistor and deactivating a second switch coupled between the first voltage terminal and the control node of the switching transistor, wherein the first switching state of the switching transistor is an off-state;
setting the switching transistor to the first switching state under a second operating condition by activating the second switch coupled between the first voltage terminal and the control node of the switching transistor; and
setting the switching transistor to a second switching state by activating a third switch coupled between a second voltage terminal and the control node of the switching transistor, wherein the second switching state of the switching transistor is an on-state, wherein setting the switching transistor to the first switching state under the first operating condition and setting the switching transistor to the first switching state under the second operating condition further comprises providing a same voltage to the control node of the switching transistor, wherein a first resistor having a first resistance value is coupled between the first switch and the control node of the switching transistor, and a second resistor having a second resistance value is coupled between the second switch and the control node of the switching transistor, and wherein the first operating condition is associated with lower temperatures than the second operating condition, and wherein the first resistance value is higher than the second resistance value.

13. The method of claim 12, wherein the first operating condition is associated with a startup phase, and the second operating condition is associated with a phase after startup.

14. A device, comprising:
a first switch coupled between a first voltage terminal and a first drive terminal configured to be coupled to a control terminal of a switch transistor via a first resistor, wherein the first voltage terminal is configured to provide a first voltage associated with a first switching state of the switch transistor;
a second switch coupled between the first drive terminal and a second drive terminal configured to be coupled to the control terminal of the switch transistor via a second resistor;
a third switch coupled between the first drive terminal and a second voltage terminal, wherein the second voltage terminal is configured to provide a second voltage associated with a second switching state of the switch transistor different from the first switching state; and
a circuit to control the first, second and third switches depending on a switching state to which the switch transistor is to be set and depending on an operating condition associated with temperature.

15. The device of claim 14, further comprising a diode coupled between the second drive terminal and the second resistor.

16. The device of claim 14, wherein the circuit is configured to open the third switch in operating conditions associated with higher temperatures and to close the third switch in operating conditions associated with lower temperatures.

* * * * *